Figure 1:
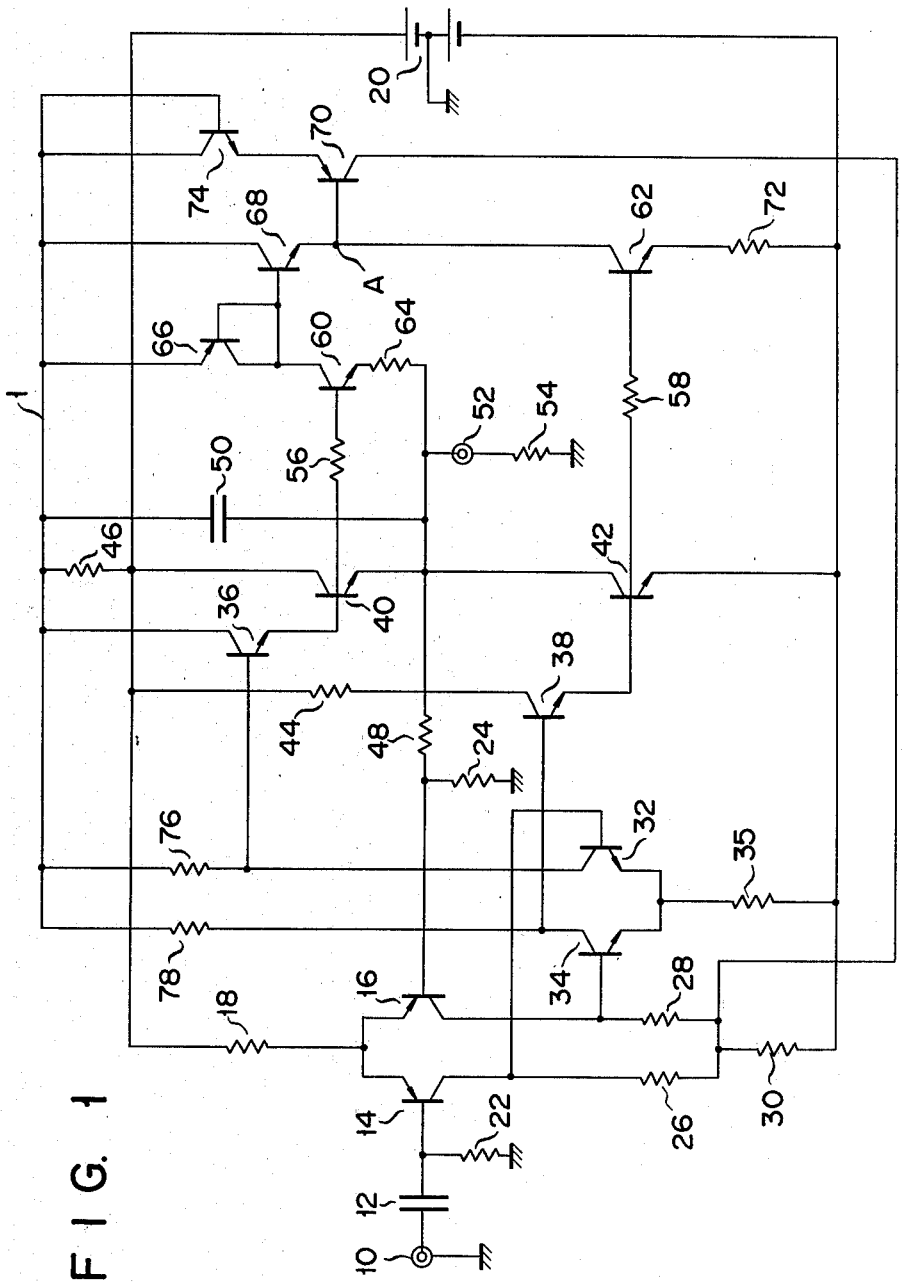

United States Patent [19]

Yamaguchi et al.

[11] 4,333,059
[45] Jun. 1, 1982

[54] POWER AMPLIFYING CIRCUIT

[75] Inventors: Hiroyasu Yamaguchi, Yokohama; Takashi Ishii, Fujisawa, both of Japan

[73] Assignee: Tokyo Shibaura Denki Kabushiki Kaisha, Japan

[21] Appl. No.: 134,676

[22] Filed: Mar. 27, 1980

[30] Foreign Application Priority Data

Mar. 31, 1979 [JP] Japan .................................. 54/38635

[51] Int. Cl.$^3$ ............................................. H03F 3/26
[52] U.S. Cl. ..................................... 330/265; 330/297
[58] Field of Search ........................ 330/265, 271, 297

[56] References Cited

U.S. PATENT DOCUMENTS

| 2,789,164 | 4/1957 | Stanley ................................ 330/265 |
| 3,904,974 | 9/1975 | Fakaya ................................ 330/265 |

FOREIGN PATENT DOCUMENTS

| 2711912 | 9/1977 | Fed. Rep. of Germany . |
| 1129767 | 10/1968 | United Kingdom . |
| 1384709 | 2/1975 | United Kingdom . |
| 1434178 | 5/1976 | United Kingdom . |
| 1545357 | 5/1979 | United Kingdom . |

OTHER PUBLICATIONS

Huijsing, "Monolithic Operational Amplifier Design with Improved HF Behavior", IEEE Journal of Solid State Circuits, vol. SC-11, No. 2, Apr. 1976, pp. 323-328.
"Transistors Auto Amplifiers", by D. Jones and R. Ghea, 1968, pp. 176 to 178, 190, 191 and 247.
Telefunken Brochure "Semiconductor News for the Industry", 6503 114 of Oct. 1965, pp. 2 and 3.

*Primary Examiner*—Michael J. Tokar
*Attorney, Agent, or Firm*—Finnegan, Henderson, Farabow, Garrett & Dunner

[57] ABSTRACT

A power-amplifying circuit embodying this invention comprises a pre-amplifier for amplifying an input signal, a push-pull amplifier including first and second transistors driven in accordance with an output from the pre-amplifier, and a feedback circuit which detects output currents from the first and second transistors and supplies a current corresponding to a product of output currents from the first and second transistors to the pre-amplifier through a negative feedback path in order to regulate the quiescent currents of the first and second transistors. The push-pull amplifier is driven by a power source having a prescribed level of voltage. The feedback circuit and pre-amplifier are driven by an auxiliary power source whose voltage is obtained by adding through a bootstrap capacitor the output voltage from the push-pull amplifier to a referential voltage slightly lower than the power supply voltage by a resistor.

4 Claims, 3 Drawing Figures

POWER AMPLIFYING CIRCUIT

This invention relates to a power-amplifying circuit, whose output stage is formed of a push-pull pair of transistors.

Hitherto, difficulties have been encountered in forming a PNP transistor with a large current capacity in an integrated power-amplifying circuit. Therefore, the output stage of the conventional power-amplifying circuit is formed of quasi-complementary type single-ended push-pull amplifier. However, a lateral type PNP transistor used in this application has the drawbacks that it has a small current capacity, a low current amplification factor and a small gain bandwidth product (fT), and consequently readily gives rises to oscillation. The lateral type transistor capable of amplifying a large current has too large an effective area to be used in as integrated circuit. Where both transistors of the complementary pair of transistors of the output stage are in common-emitter configuration, than the amplifitude of an output can indeed be increased even without applying a bootstrap circuit. However, difficulties are presented in providing a quiescent current for the output stage of a power-amplifying circuit for thermal stability and for elimination of crossover distortions in class AB or B. Or where the output stage of a power-amplifying circuit is only formed of NPN transistors having a large current capacity, instead of complementary type transistor, then the resultant power-amplifying circuit is indeed adapted for integration, since it is not necessary to use a large chip size lateral type transistor. In this case, too, difficulties arise in providing a quiescent current.

It is accordingly the object of this invention to provide a power-amplifying circuit, wherein the quiescent current of a push-pull pair of output transistors can be easily set at a prescribed level, thereby eliminating the occurrence of crossover distortions and ensuring the stable and reliable operation of the power-amplifying circuit, and consequently rendering the circuit more adapted for integration.

To this end, the present invention provides a power-amplifying circuit which comprises a pre-amplifier means for amplifying an input signal an output means including a push-pull pair of first and second transistors driven in accordance with an output signal from the pre-amplifier means, a feedback means for detecting currents of the first and second transistors of the output means and for supplying a signal corresponding to a product of the currents detected to the pre-amplifier means through a negative feedback path in order to regulate the quiescent currents of the first and second transistors, a power supply terminal connected to the output means to be impressed with a prescribed level of voltage, and a bias terminal connected to the preamplifier means and feedback means, and, in at least part of the active period of the output means, is supplied with a higher voltage than prescribed voltage impressed to the power supply terminal.

Figure 2:
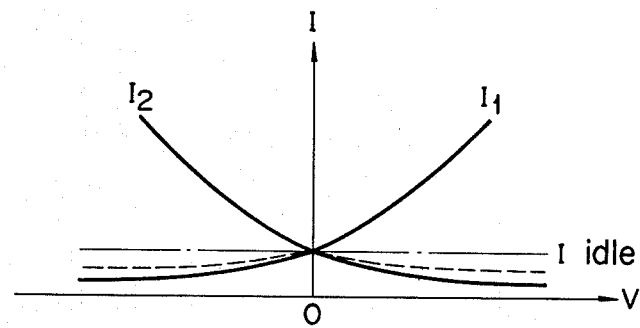
Figure 3:
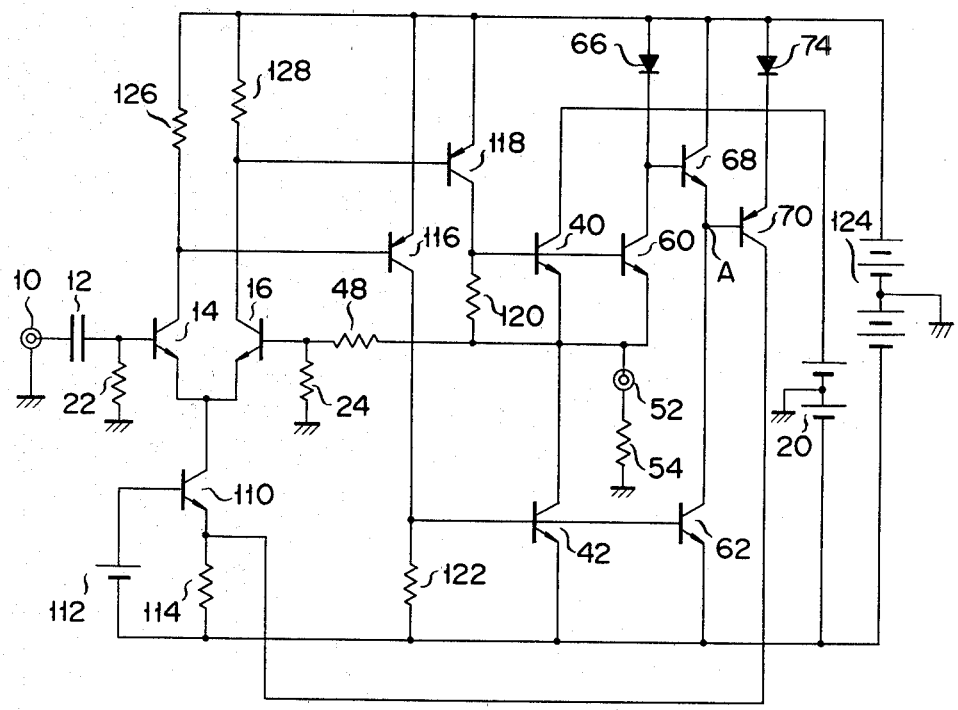

This invention can be more fully understood from the following detailed description when taken in conjunction with the accompanying drawings, in which:

FIG. 1 shows the arrangement of a power-amplifying circuit according to one embodiment of this invention;

FIG. 2 indicates the output characteristics of the power-amplifying circuit of FIG. 1; and FIG. 3 indicates the arrangement of a power-amplifying circuit according to another embodiment of the invention.

A power-amplifying circuit according to one embodiment of this invention is now described by reference to FIG. 1. An input jack 10 whose outer terminal is grounded has its inner terminal connected to the base of a PNP transistor 14 through a capacitor 12. The emitter of the transistor 14 is connected to the emitter of a PNP type transistor 16. A junction of the emitters of both transistors 14 and 16 is connected to the positive terminal of a D.C. power source 20 through a resistor 18. The bases of the transistors 14 and 16 are grounded through the corresponding resistors 22 and 24. The collector of the transistor 14 is connected to one end of a resistor 26. The collector of the transistor 16 is connected to one end of a resistor 28. The other ends of the resistors 26 and 28 are connected together and further to the negative terminal of the D.C. power source 20 through a resistor 30. The transistors 14 and 16 jointly constitute a differential amplifier in a first stage of a pre-amplifier stage.

The collectors of the transistors 14 and 16 are respectively connected to the bases of NPN transistors 32 and 34 jointly constituting a differential amplifier in a drive stage of the pre-amplifier stage. The emitters of the transistors 32 and 34 are connected together and further to the negative terminal of the D.C. power source (20) through a resistor 35. The collector of the transistors 32 and 34 are respectively connected to the bases of NPN type transistors 36 and 38. The emitters of the transistors 36 and 38 are respectively connected to the bases of NPN type transistors 40 and 42. The collector of the transistor 38 is connected to the positive terminal of the D.C. power source 20 through a resistor 44. The collector of the transistor 40 is connected to the positive terminal of the D.C. power source 20 and also to one end of a resistor 46, the other end of which is connected to the collector of the transistor 36. In other words, the transistors 36 and 40 jointly constitute a Darlington circuit. The emitter of the transistor 40 is connected to the collector of the transistor 42, and also to the base of the transistor 16 through a resistor 48. The emitter of the transistor 40 is further connected to one end of a capacitor 50 and the inner terminal of an output jack 52. The outer terminal of the output jack 52 is grounded through a load 54, for example, a speaker. The emitter of the transistor 42 is connected to the negative terminal of the D.C. power source 20.

The transistors 36, 38, 40 and 42 jointly constitute the output stage of the power-amplifying circuit according to the foregoing embodiment. This embodiment whose output stage is only formed of NPN transistors provides an output having a large amplitude and is rendered suitable for integration.

The bases of the output transistors 40 and 42 are respectively connected to the bases of NPN type transistors 60 and 62 through the corresponding compensation resistors 56 and 58. The transistors 60 and 62 jointly constitute the detection stage of the output stage of the power-amplifying circuit. The emitter of the transistor 60 is connected to the emitter of the transistor 40 through a compensation resistor 64. The collector of the transistor 60 is connected to the collector of a PNP type transistor 66 acting as a diode with the base and collector short-circuited, and also to the base of an NPN type transistor 68. The emitter of the transistor 68 is connected to the collector of the transistor 62 and also to the base of a PNP type transistor 70. The emitter of the transistor 62 is connected to the negative terminal of the D.C. power source 20 through a compensation resistor 72. The collector of the transistor 70 is connected to the junction of the resistors 26, 28 and 30. The emitter of the transistor 70 is connected to the emitter of an NPN transistor 74 acting as a diode with the base and collector short-circuited. The collector of the transistor 74 is connected to the collector of the transistor 68, the emitter of the transistor 66, the other end of the capacitor 50 and also to the junction of the resistor 46 and the collector of the transistor 36, and further to the collectors of the transistors 32 and 34 through corresponding resistors 76 and 78. The capacitor 50 is of the bootstrap type. The transistors 66, 68, 70 and 74 jointly constitute a feedback stage.

Description is now given of the operation of a power-amplifying circuit according to the foregoing embodiment. Now let it be assumed that the input jack 10 is supplied with a sine wave signal whose positive and negative half cycles recur alternately with the ground potential taken as a reference. Then, the input signal is supplied to the base of the transistor 14 constituting one of the input terminals of a differential amplifier through a time constant circuit formed of the capacitor 12 and resistor 22. Therefore, the transistors 14 and 16 jointly constituting the differential amplifier are driven alternately in accordance with the positive or negative half cycle of the input signal. Issued from the collector of the transistor 14 is an amplified signal in the form inverted from an input signal. Sent forth from the transistor 16 is an amplified signal in the form noninverted from an input signal. The transistors 32 and 34 are alternately driven by the collector currents of the corresponding transistors 14 and 16. Therefore an amplified signal is emitted from the collector of the transistor 32 in the form inverted from an input signal. An amplified signal is issued from the collector of the transistor 34 in the form noninverted from an input signal. The collector currents of the transistors 32 and 34 lead to a voltage drop in the corresponding resistors 76 and 78. Thus, the transistor 36 is operated when an input signal is in a positive cycle. The transistor 38 is operated when an input signal is in a negative cycle. The transistors 40 and 42 respectively constitute Darlington circuits with the corresponding transistors 36 and 38. Therefore an amplified output current is generated from the transistor 40 in the form noninverted from an input signal. An amplified output current is produced from the transistor 42 in the form inverted from an input signal. A signal corresponding to a difference between the output currents from the transistors 40 and 42 is supplied to the load 54 through the output jack 52. Where the output transistors 40 and 42 are biased in class B, then, the output stage of the power-amplifying circuit acts as a push-pull amplifier which respectively amplifies the positive and negative half components of input signals. Among outputs from the transistors 40 and 42, all the D.C. voltage component and part of the A.C. voltage component are supplied to the base of the transistor 16 through a negative feedback path having a resistor 48.

The bases of the transistors 60 and 62 are respectively connected to the bases of the corresponding transistors 40 and 42. Therefore, the transistors 60 and 62, as well as the transistors 40 and 42, are respectively driven by the emitter current of the transistors 36 and 38. The collector currents of the transistors 60 and 62 are respectively supplied to the transistors 66 and 68. An arithmetic operation described below is carried out by the transistors 66, 68, 70 and 74. A current obtained as a result of the arithmetic operation is supplied from the collector of the transistor 70 to the transistors 14 and 16 constituting the differential amplifier in the preamplifier stage of the power-amplifying circuit through a negative feedback path. The arithmetic operation is carried out as follows. Now let it be assumed that the operating currents of the transistors 40, 42, 60, 62 and 70 (the currents flowing through these corresponding transistors) are respectively denoted by $I_1$, $I_2$, $I_3$, $I_4$ and $I_F$, and the emitter areas of the transistors 40 and 60 have a ratio N:1, the emitter areas of the transistors 42 and 62 also have the ratio N:1. Then the operating currents $I_1$ and $I_3$ have a relationship expressed by the following equation:

$$I_3 = I_1/N$$

The operating currents $I_2$ and $I_4$ have a relationship expressed by the following equation:

$$I_4 = I_2/N$$

A potential at point A indicated in FIG. 1 is expressed as a sum of the base-emitter voltage $V_{BE}$ 66 of the transistor 66 and the base-emitter voltage $V_{BE}$ 68 of the transistor 68, or a sum of the base-emitter voltage $V_{BE}$ 74 of the transistor 74 and the base-emitter voltage $V_{BE}$ 70 of the transistor 70. Now let it be assumed that the reverse saturation current of the PNP type transistor 66 is denoted by $I_{SP}$, the reverse saturation current of the NPN type transistor 68 is represented by $I_{SN}$, the emitter areas of the transistors 66 and 70 have a ratio of $K_1$:1, the emitter areas of the transistors 68 and 74 have a ratio of $K_2$:1, and the current amplification factors of these transistors are large enough to neglect the base currents. Then, the base-emitter voltages $V_{BE}$ 66, $V_{BE}$ 68, $V_{BE}$ 74 and $V_{BE}$ 70 of the transistors 66, 68, 74 and 70 are respectively expressed as follows.

$$V_{BE}66 = \frac{kT}{q} \ln \frac{I_3}{I_{SP}}$$

$$V_{BE}68 = \frac{kT}{q} \ln \frac{I_4}{I_{SN}}$$

$$V_{BE}74 = \frac{kT}{q} \ln \frac{I_F}{K_2 I_{SN}}$$

$$V_{BE}70 = \frac{kT}{q} \ln \frac{I_F}{K_2 I_{SP}}$$

where:
K = Boltzmaan constant
T = absolute temperature
q = charge of an electron In this case, the transistor 68 has so large a current amplification factor $\beta$ that the current flowing through the transistor 66 may be regarded as the operating current $I_3$ of the transistor 60, the current flowing through the transistor 68 may be regarded as the operating current $I_4$ of the transistor 62, and the current flowing through the transistor 74 may be regarded as the operating current $I_F$ of the transistor 70.

The following relationship is obtained from the above four equations with respect to the potential at point A of FIG. 1.

$$\ln\frac{I_3}{I_{SP}} + \ln\frac{I_4}{I_{SN}} = \ln\frac{I_F}{K_2 I_{SN}} + \ln\frac{I_F}{K_1 I_{SP}}$$

$$I_F = \sqrt{K_1 K_2 I_3 I_4} \approx \sqrt{I_3 I_4} \approx \sqrt{I_1 I_2}$$

(where: $K_1 K_2 \approx 1$)

Since the operating current $I_F$ of the transistor 70 is supplied from the collector thereof to the pre-amplifier stage of the power-amplifying circuit through a negative feedback path, the following equation may further result.

$$R_{30}\left(I_F + I_{14} - \frac{I_{32}}{\beta} + I_{16} - \frac{I_{34}}{\beta}\right) +$$

$$R_{28}\left(I_{16} - \frac{I_{34}}{\beta}\right) = V_{BE34} + R_{35}(I_{32} + I_{34})$$

$$R_{30}(I_F + I_{14} + I_{16}) + R_{28} I_{16} = V_{BE34} + R_{35}(I_{32} + I_{34})$$

$$\therefore R_{30} I_F = V_{BE34} + R_{35}(I_{32} + I_{34}) - (R_{28} + 2R_{30})\frac{I_o}{2}$$

where:

$V_{BE32} \approx V_{BE34}$ $I_{14} = I_{16} = (I_o/2)(1 - (1/\beta)) \approx (I_o/2)$ $V_{BE32}$ and $V_{BE34}$ = respectively the base-emitter voltages of the transistors 32 and 34

$I_{14}, I_{16}, I_{32}$ and $I_{34}$ = respectively collector currents of the transistors 14, 16, 32 and 34

$I_o$ = current flowing through the resistor 18

$R_{28}, R_{30}$ and $R_{35}$ = resistances of the resistors 28, 30 and 35. $\beta$ = current amplification rate ($\geq 1$)

Therefore the operating current $I_F \approx \sqrt{I_1 I_2}$ of the transistor 70 is substantially constant. In other words, the values of operating currents of the output transistors 40 and 42 have an inverse ratio as seen from FIG. 2. Where an input voltage V has a positive value, then the operating current $I_1$ of the transistor 40 increases. An operating current $I_2$ of the transistor 42 decreases accordingly. The reverse is the case, if an input voltage V has a negative value. As described above the output stage of the power-amplifying circuit carries out a push-pull operation. At input voltage V=0, then $I_1 = I_2$. Therefore the quiescent current Iidle of the transistors 40 and 42 may be expressed as follows:

Iidle ≈ $I_F$

With the power-amplifying circuit of this embodiment, the quiescent current Iidle can be easily set at a proper value. Moreover, the value can be kept constant. A dot-dash line indicated in FIG. 2 represents $I_F$ (=$\sqrt{I_1 I_2}$). At input voltage V=0, then the dot-dash line denotes a value corresponding to the quiescent current Iidle. The definition of quiescent current Iidle, however, is subject to a certain condition. This condition is that the transistors 60 and 62 for detecting the operating currents of the transistors 40 and 42 of the output stage of the power-amplifying circuit should always be operated under an active condition without being saturated. The reason for this runs as follows. The base-emitter voltages of the transistors 40 and 42 of the output stage are equal to the base-emitter voltages of the detection transistors 60 and 62, respectively. If, in case the output stage of the power-amplifying circuit shown in FIG. 1 carries out a push-pull operation, the potential of the output terminal 52, i.e., the emitter potential of the output transistor 40 considerably increases, when an input voltage has a positive value. Then, the transistor 40 is saturated at high currents. The emitter potential of the transistor 40 raises the potential 0.2 to 0.5 (V) below the potential of the positive terminal. Since the transistor 60 has the diode 66 as a load at the collector, the transistor 60 is saturated. The operating current of the transistor 60 is reduced to zero. The feedback current (the operating current $I_F$ of the transistor 70) also falls to zero. As a result, the operating current flowing through the output transistor 40 suddenly increases or gives rise to abnormalities such as the occurrence of oscillation.

To suppress the above-mentioned drawbacks, the output stage of the power-amplifying circuit of this invention is connected to the D.C. power source 20. The detection and feedback stages of the power-amplifying circuit are connected to an auxiliary power supply line 1 whose voltage is different from that of the D.C. power source 20. This auxiliary power supply voltage has a referential voltage which is set at a level somewhat lower than the voltage of the D.C. power source 20. The auxiliary power supply voltage is obtained by adding an output voltage from the output stage to the referential voltage through the bootstrap capacitor 50. Since the positive voltage is provided at the output terminal 52 and the auxiliary power supply voltage increases by the capacitor 50 where the input voltage has a positive value, even when the transistor 40 gets saturated, the detection transistor 60 remains unsaturated. As a result, the quiescent current Iidle of the output transistor 40 can be substantially kept constant without the disruption of the relationship of $I_F$(feedback current) ≈ $\sqrt{I_1 I_2}$.

The compensation resistors 56, 64, 58 and 72 included in the detection stage of the power-amplifying circuit are intended to counterbalance the effect of parasitic resistance occurring in the base and emitter regions of the output transistors 40 and 42. Under an idealistic condition, the operating currents of the output transistors 40 and 42 and those of the detection transistors 60 and 62 have a relationship expressed by the equations (1) and (2). Actually, however, voltage drops resulting from the parasitic resistances cause the base-emitter voltages of the output transistors 40 and 42 to increase over a theoretic value. As a result, the operating currents of the detection transistors 60 and 62 rise above the values expressed by the equations (1) and (2). An output transistor in an inoperative cycle is not much affected by a voltage drop resulting from the above-mentioned parasitic resistance. Therefore, the current detected by the detection stage of the power-amplifying circuit does not match with the operating current of the output stage, even though the feedback current $I_F$ may be kept constant. Consequently, a product of the operating currents $I_1$ and $I_2$ of the output transistors 40 and 42 remains unstable, preventing the operating currents of the output transistors 40 and 42 from sufficiently increasing or unduly reducing the operating current of an output transistor in an inoperative cycle and eventually leading to switching distortions. To suppress the above-mentioned difficulties, it is advised to let a compensation resistor have a resistance N times larger than the value of a parasitic resistance (N denotes the value of a ratio between the emitter areas of the transistors 40 and 60). If the compensation resistor is made to have a resistance over N times larger than the value of a parasitic resistance, then the operating current of an output transistor in an inoperative cycle can be increased as shown in broken lines in FIG. 2, thereby suppressing the occurrence of crossover or notching distortions. This favorable effect can be accounted for by the fact that the feedback current is kept constant, an output transistor in an operative cycle is more effected by a compensation resistor and eventually is reduced in the operating current. Thus the operating current of an output transistor in an inoperative cycle rather increases.

A power-amplifying circuit according to another embodiment of this invention is now described with reference to FIG. 3. The parts which are the same as those of FIG. 1 are denoted by the same numerals.

An input jack 10 is connected to the base of an NPN type transistor 14 through a capacitor 12. The emitters of the transistor 14 and NPN type transistor 16 are connected together. The emitters of both transistors 14 and 16 are connected to the collector of an NPN transistor 110. The base of the transistor 110 is connected to the positive terminal of a bias power source 112, whose negative terminal is connected to the negative terminal of the D.C. power source 20. The emitter of the transistor 110 is connected to the negative terminal of a D.C. power source 20 through a resistor 114. The bases of the transistors 14 and 16 are grounded through corresponding resistors 22 and 24. The collectors of the transistors 14 and 16 are respectively connected to the bases of PNP type transistors 116 and 118. The collector of the transistor 118 is connected to the bases of NPN transistors 40 and 60, and also to the emitter of the transistor 40 through a resistor 120. The collector of the transistor 116 is connected to the bases of NPN type transistors 42 and 62, and also to the emitter of the transistor 42 through a resistor 122. The collector of the transistor 40 is connected to the positive terminal of the D.C. power source 20. The emitter of the transistor 40 is connected to the collector of the transistor 42 and the base of the transistor 16 through a resistor 48, and further to an output jack 52. The output jack 52 is grounded through a load 54 such as a speaker. The emitter of the transistor 60 is connected to the emitter of the transistor 40. The collector of the transistor 60 is connected to the cathode of a diode 66 and the base of an NPN type transistor 68. The emitters of the transistors 42 and 62 are connected to the negative terminal of the D.C. power source 20. The collector of the transistor 62 is connected to the emitter of the transistor 68 and the base of a PNP type transistor 70. The collector of the transistor 70 is connected to the emitter of the transistor 110. The emitter of the transistor 70 is connected to the cathode of a diode 74. The negative terminal of an auxiliary D.C. power source 124 having a higher voltage than the D.C. power source 20 is connected to the negative terminal of the D.C. power source 20. The positive terminal of the auxiliary D.C. power source 124 is directly connected to the collector of the transistor 68, the anodes of the diodes 74 and 66 and the emitters of the transistors 116 and 118, and also to the collectors of the transistors 14 and 16 through corresponding resistors 126 and 128.

Description is now given of the operation of a power-amplifying circuit according to the embodiment of FIG. 3. Where a sine wave signal is supplied to the input jack 10, then the collector of the transistor 14 sends forth an amplified output signal having the same phase as the input signal, and the collector of the transistor 16 emits an output amplified signal having a phase inverted from that of the input signal. The transistor 116 is driven by the amplified output signal from the collector of the transistor 14 when an input signal has a positive value, and the transistor 118 is driven by the amplified output signal from the collector of the transistor 16 when an input signal has a negative value. The output transistors 40 and 42 are respectively driven by the output currents from the collectors of the transistors 118 and 116. Therefore, an output amplified current from the transistor 40 has a phase inverted from that of an input current, and an output amplified current from the transistor 42 has the same phase as an input current. A signal corresponding to a difference between both output amplified currents from the transistors 40 and 42 is supplied to the load 54 such as a speaker through the output jack 52. Where, with the above-mentioned embodiment, the output transistors 40 and 42 are biased in class B, then the output stage of the power-amplifying circuit carries out class B push-pull operation.

Among the output signals, all the D.C. voltage component and part of the A.C. component are supplied to the base of the transistor 16 through a negative feedback path having a resistor 48. As in the first embodiment, the operating currents of the transistors 40 and 42, that is, output currents $I_1$ and $I_2$ therefrom are respectively detected by the transistors 60 and 62. The operating currents $I_3$ and $I_4$ of the transistors 60 and 62 are synthesized by the feedback stage formed of the transistors 68 and 70 and diodes 66 and 74, thereby providing the operating current $I_F(\approx\sqrt{I_3 I_4})$ of the transistor 70. This current $I_F$ is supplied through a negative feedback path to a constant circuit formed of the transistor 110, bias power supply 112 and resistor 114 included in the pre-amplifier stage and is substantially kept constant. Therefore, the output currents $I_1$ and $I_2$ from the output transistors 40 and 42 have an inverse relationship illustrated in FIG. 2. Where the quiescent current of the output transistors 40 and 42 increases, then the feedback current also increases. As a result, the pre-amplifier stage of the power-amplifying circuit is controlled by the constant current circuit to decrease the quiescent current of the output transistors 40 and 42 to a substantially constant level. The output stage alone of the second embodiment is driven by the D.C. power source 20, and the remaining preamplifier stage, drive stage, and feedback stage of the power-amplifying circuit are driven by the auxiliary power source voltage higher than that of the D.C. power source 20. Where, therefore, the output transistors 40 and 42 are saturated, the feedback stage remains unsaturated, thereby insuring the same effect as in the first embodiment. The second embodiment lacks a compensation resistor designed to counterbalance the effect of a parasitic resistance occurring in the output stage. Obviously, it is much better to provide the compensation resistor.

What we claim is:

1. A power-amplifying circuit which comprises:
   pre-amplifier means for amplifying an input signal;
   output means including a push-pull pair of first and second transistors driven in accordance with an output signal from said pre-amplifier means;
   feedback means for detecting currents of said first and second transistors and for supplying a signal corresponding to a product of the currents detected to said pre-amplifier means through a negative feedback path in order to regulate the quiescent currents of said first and second transistors;

a power supply terminal which is connected to said output means with a prescribed level of voltage impressed thereon; and bias means connected to said feedback means and pre-amplifier means for selectively providing a voltage thereto higher than said prescribed level of voltage.

2. The power-amplifying circuit according to claim 1, wherein said first and second transistors are formed of NPN type transistors; said feedback means comprises third and fourth transistors whose bases are respectively connected to those of said first and second transistors, fifth and sixth transistors which are respectively driven by output currents from the collectors of said third and fourth transistors, and whose bases are connected together, and seventh and eighth transistors whose base-emitter voltages are added together to a sum equal to those of base-emitter voltages of said fifth and sixth transistors, and an output current from one collector of seventh and eighth transistor is supplied to said pre-amplifier means through the negative feedback path; and said bias terminal is connected to the power supply terminal through a resistor and also to the output terminal of said output means through a bootstrap circuit.

3. The power-amplifying circuit according to claim 2, wherein said fifth and seventh transistors act as diodes with the respective base and collector shortcircuited; and said bias terminal is connected to a power source having a higher voltage than said prescribed voltage level impressed on said power supply terminal.

4. The power-amplifying circuit according to claim 1, wherein said feedback means supplies said preamplifier means through the negative feedback path with a signal corresponding to a difference between a product of output currents from said first and second transistors and a constant current generated by a constant current source.

* * * * *